United States Patent [19]

Kobayashi

[11] Patent Number: 4,826,556

[45] Date of Patent: May 2, 1989

[54] PLASTIC MOLD DECAPSULING APPARATUS

[75] Inventor: Nobutoshi Kobayashi, Tokyo, Japan

[73] Assignees: Nippon Scientific Co., Ltd.; Kusumoto Chemicals Co., Ltd., both of Japan

[21] Appl. No.: 199,708

[22] Filed: May 27, 1988

[30] Foreign Application Priority Data

Oct. 1, 1987 [JP] Japan .......................... 62-149247[U]

[51] Int. Cl.⁴ ...................... B44C 1/22; B29C 37/00; C03C 15/00; C03C 25/06

[52] U.S. Cl. .................................. 156/345; 156/640; 156/655; 156/668

[58] Field of Search ............... 156/345, 640, 654, 655, 156/668, 344, 584; 134/105, 198, 200; 437/225

[56] References Cited

U.S. PATENT DOCUMENTS 4,344,809  8/1982  Wensink ............................ 156/345
4,359,360  11/1982  Harris et al. ....................... 156/345

OTHER PUBLICATIONS

ISTFA 1985 International Symposium for Testing and Failure Analysis, Oct. 21–23, 1985.

Primary Examiner—William A. Powell
Attorney, Agent, or Firm—Wigman & Cohen

[57] ABSTRACT

A plastic mold decapsuling apparatus for decapsuling a plastic mold by feeding an etchant to the plastic mold comprises an etchant bottle; an etchant tank; a decapsuling plastic mold holder; an etchant feeding pump; and, in particular, a bell-shaped cover cap for shielding a plastic mold to be decapsuled on the mold holder from outside air to maintain pressure of the etchant fed by the etchant feeding pump. Since the plastic mold is shielded, even if the plastic mold is decapsuled, it is possible to maintain the etchant feeding pressure at a constant level without introducing outside air into the etchant recirculating passage, thus permitting a stable decapsuling treatment.

8 Claims, 4 Drawing Sheets

PLASTIC MOLD DECAPSULING APPARATUS

BACKGROUND OF THE INVENTION

1. Field of the Invention

The present invention relates generally to a plastic mold decapsuling apparatus and more specifically to a plastic mold sample holder incorporated in the decapsuling apparatus. The apparatus can dissolve a joint surface of a plastic mold or resin capsuled device such as semiconductor chip, capacitor, hybrid integrated circuit, etc. in order to inspect causes of detectiveness of the device.

2. Description of the Prior Art

In the conventional plastic mold decapsuling apparatus, a plastic mold device sample is usually mounted on a sample holder upside down and depressed onto the sample holder by a socket or a sample push bar, so that the plastic mold sample will not be moved or disclosed when an etchant is jetted to the sample for decapsuling treatment.

In the prior-art plastic mold sample holder of the decapsuling apparatus, however, since the device sample to be decapsuled is only pushed down, when the device sample is partialy broken or damaged, there exists a problem in that air is readily introduced into the etchant chamber formed in the sampled holder so that etchant jetting pressure is decreased when etchant is supplied under pressure or increased when etchant is supplied under vacuum (negative pressure). Once the etchant pressure changes, since etchant cannot be supplied sufficiently, it is impossible to effectively perform a reliable decapsuling treatment.

Further, when a large integrated circuit is embedded within a plastic mold, since the mold device sample must be decapsuled completely, there exists a problem in that air is also readily introduced into the etchant chamber formed in sample holder and therefore it is also impossible to continue a reliable etchant treatment.

Further, in case a device sample is decapsuled at a little dislocated position, it is necessary to decapsule again the same device sample. In this case, there exists a problem in that air is also introduced into the etchant chamber from outside, so that it is impossible to further decapsule the device sample.

Further, when the plastic mold sample is spherical in shape, air is easily introduced into the etchant chamber and therefore reliable decapsuling treatment is disabled.

Furthermore, when a plastic mold device sample is being decapsuled, plastic broken pieces are often produced or separated from the sample. Therefore, there exists another problem in that the etchant supply passage and/or the waste etchant discharge passage are clogged by separated plastic mold pieces.

SUMMARY OF THE INVENTION

With these problems in mind, therefore, it is the primary object of the present invention to provide a sample holder for a plastic mold decapsuling apparatus which can reliably decapsule any plastic mold device samples, for instance which are partially broken, include a relatively large integrated circuit, are spherical in shape, etc. without introducing air into pressurized or depressurized etchant chamber from the outside during etchant treatment.

It is another object of the present invention to provide a plastic mold decapsuling apparatus which can effectively prevent broken plastic mold pieces from being mixed with the etchant or prevent the etchant and/or waste etchant discharge passage from being clogged with the broken pieces.

To achieve the first above-mentioned object, the plastic mold decapsuling apparatus for decapsuling a plastic mold by feeding an etchant to the plastic mold, according to the present invention, comprises: (a) means for storing an etchant; (b) means for heating the etchant stored in said storing means; (c) means for supporting a plastic mold to be decapsuled; (d) means for feeding the etchant heated by said heating means to the plastic mold supported by said supporting means to decapsule the plastic mold; and (e) means for shielding the plastic mold supported by said supporting means from outside air to maintain pressure of the etchant fed to said feeding means.

The plastic mold shielding means is a bell-shaped cover cap made of glass. Further, it is preferable to push down a plastic mold against the plastic mold supporting means by elastic means and to fix the cover cap from outside of the cover cap.

To achieve the second above-mentioned object, the plastic mold supporting means of the present invention comprises filter means, disposed between an etchant nozzle end and a decapsule surface of the plastic mold in said plastic mold supporting means, for preventing broken plastic mold pieces from being mixed with the etchant being fed. Further, it is preferable that said plastic mold supporting means further comprises a trap for trapping plastic mold pieces, said trap being formed by projecting the etchant nozzle end and a waste etchant discharge passage end from a bottom of an etchant chamber formed in said plastic mold supporting means.

BRIEF DESCRIPTION OF THE DRAWINGS

The features and advantages of the plastic mold decapsuling apparatus according to the present invention will be more clearly appreciated from the following description of the preferred embodiment of the invention taken in conjunction with the accompanying drawing, in which like reference numerals designate the same or similar elements or sections throughout the figures thereof and in which.

DETAILED DESCRIPTION OF THE PREFERRED EMBODIMENTS

Figure 1:
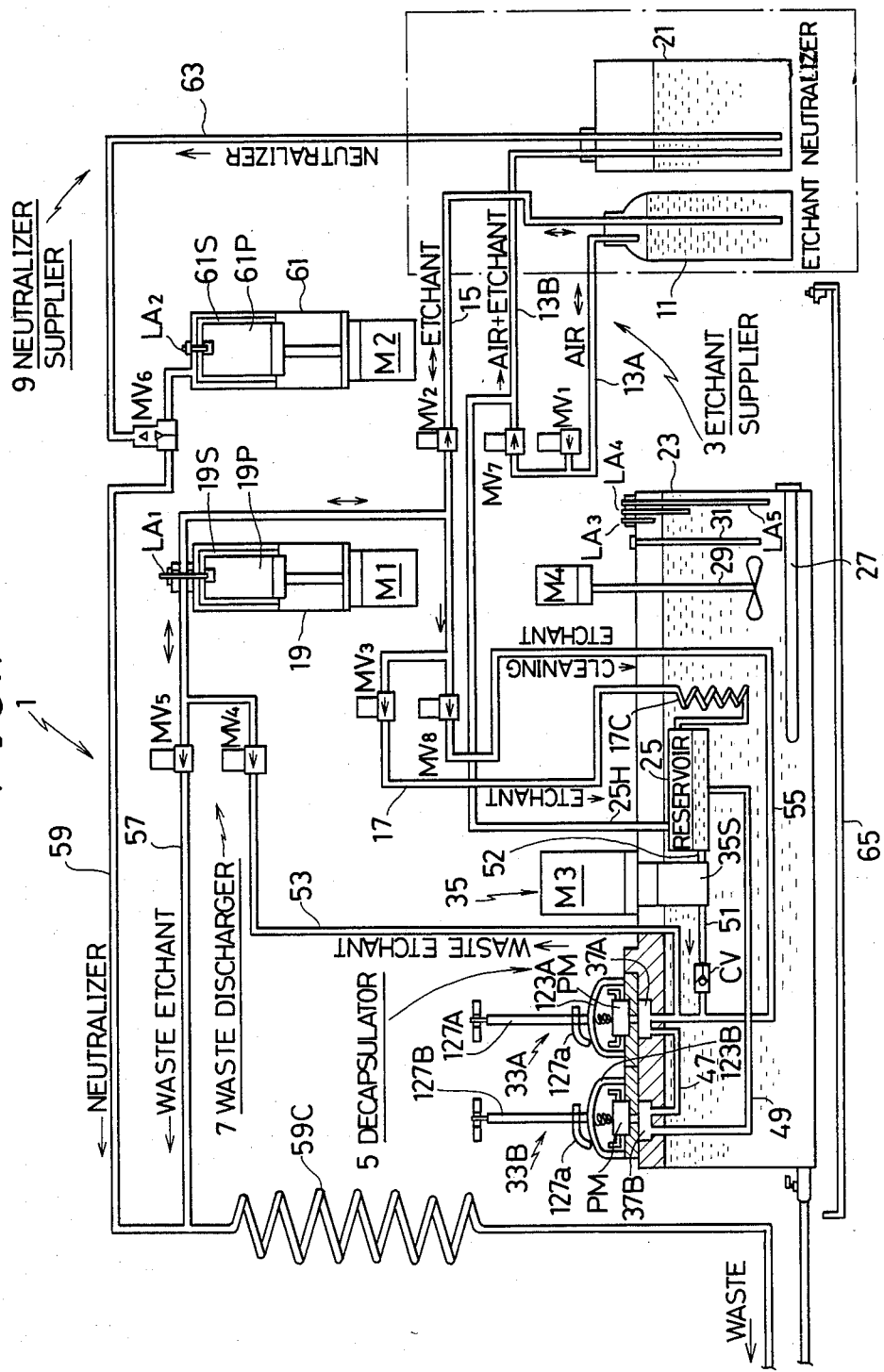
FIG. 1 is a diagrammatical illustration for assistance in explaining a plastic mold decapsuling apparatus in which the plastic mold sample holder of the present invention is incorporated.

FIG. 1 shows an embodiment of the plastic mold decapsuling apparatus of the present invention. The apparatus 1 comprises roughly means 3 for supplying etchant as fuming nitric acid, concentrated sulfuric acid, etc. (etchant supplier); means 5 for decapsuling plastic mold devices by feeding etchant from the etchant supplying means 3 (decapsulator); means 7 for discharging waste etchant produced by the decapsuling means 5

(waste discharger); and means 9 for supplying neutralizer to the waste etchant discharging means 7 (neutralizer supplier).

The etchant supplying means 3 comprises an etchant bottle 11 now on the market; a first plunger pump 19 having a plunger 19P driven by a motor M1; and some etchant feed pipes and open/close valves MV. The etchant is fuming nitric acid, concentrated sulfuric acid, etc. An air bleed pipe 13A first introduces air into the etchant bottle 11; two etchant feed pipes 15 and 17 feed etchant in the bottle 11 to the decapsuling means 5.

The decapsuling means 5 comprises a heating tank 23 having a heating unit 27, an agitator 29, a temperature sensor 31, three liquid level sensors LA3, LA4 and LA5; an etchant reservoir 25, a gear pump 35; two decapsuling plastic mold holders 33A and 33B; two cap support rods 127A and 127B; a check valve CV; and some etchant feed pipes.

The waste etchant discharging means 7 comprises the first plunger pump 19 used in common with that for the etchant supplying means 3; a spiral pipe 59C; and some waste etchant feed pipes and open/close valves MV.

The neutralizer supplying means 9 comprises a neutralizer bottle 21, a second plunger pump 61 having a plunger 61P driven by a motor M2; and some neutralizer feed pipes.

The operation of the etchant supplier 3 will be described. When the first plunger pump 19 is driven to move the plunger 19b downward with valve MV1 and MV2 open and MV3 closed, outside air is introduced from the valve MV1 to the etchant bottle 11 through the air bleed pipe 13A. On the other hand, etchant within the bottle 11 is introduced into the cylinder chamber 19S together with air through the etchant feed pipe 15. Under these conditions, when the plunger 19P is moved upward, the air is returned to the etchant bottle 11 through the etchant feed pipe 15. Further, at this moment, when the valve MV7 is opened and the valve MV1 is closed, etchant and air are fed to the neutralizer tank 21 to mix the etchant with the neutralizer by bubbling mixture.

Thereafter, when the valve MV1 is opened again and the plunger pump 19P is moved again downward by driving the motor M1, since air has already been removed from the etchant feed pipe 15 and the cylinder chamber 19S, a predetermined amount of etchant can be introduced into the cylinder chamber 19S via the etchant pipe 15 and the detection switch LA1.

When the plunger 19P is moved upward with the valve MV2 closed and the valve MV3 open, a predetermined amount of etchant introduced into the cylinder chamber 19S is fed via the etchant feed pipe 17 to the etchant reservoir 25 disposed within the heating tank 23 of the decapsulator 5, via a spiral pipe 17C.

The etchant feed pipe 17 communicates with the etchant reservoir 25 disposed within the heating tank 23 through a spiral pipe 17C serving as a heat exchanger. Therefore, etchant of a predetermined amount introduced from the etchant bottle 11 to the cylinder chamber 19S is heated and fed to the etchant reservoir 25 via the pipe 17 formed with the spiral pipe 17C placed within the heating tank 23. The liquid level sensors LA3, LA4 and LA5 are disposed on the right side wall in order to detect the height of the liquid surface level within the heating tank 23.

To introduce etchant within the etchant reservoir 25 to a single or plural decapsuling plastic mold holders 33A and 33B, the decapsulator 5 comprises a gear pump 35. This gear pump 35 is disposed at the upper middle portion of the heating tank 23. The operating unit 35S of the gear pump 35 is dipped within the heating tank 23 and driven by a driving motor M3.

The first and second decapsuling holders 33A and 33B include first and second etchant chambers 37A and 37B, and first and second cover caps 123A and 123B respectively. A plastic mold of semiconductor chip device to be decapsuled is placed upside down on first and second upper nozzle bodies (decribed later) respectively and fixed by first and second cap support rods 127A and 127B, respectively.

Figure 2:
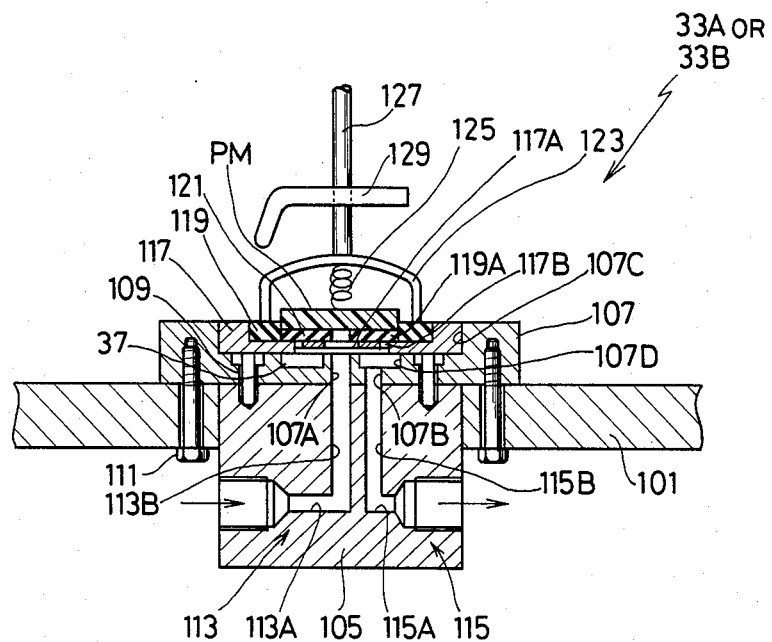
FIG. 2 is an enlarged cross-sectional view of a first embodiment of the plastic mold sample holder for the decapsuling apparatus of the present invention.
Figure 3:
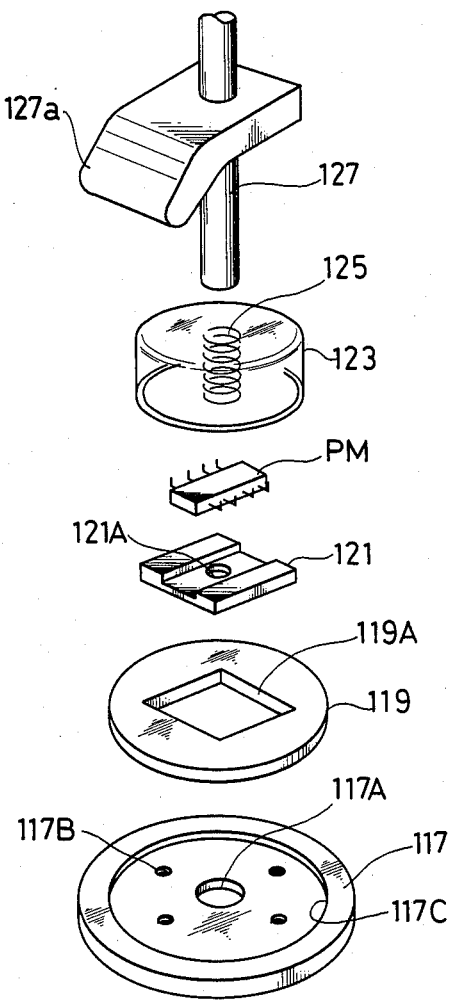
FIG. 3 is an exploded view showing the same elements used in the plastic mold sample holder shown in FIG. 2.

FIG. 2 shows a first embodiment of the decapsuling plastic mold sample holder 33A or 33B incorporated in the decapsuling apparatus and FIG. 3 shows an exploded view thereof.

In these drawings, the decapsuling holder 33A or 33B is mounted on a support frame 101. The holder 33A is composed of a lower nozzle body 105 and an upper nozzle body 107. These two bodies 105 and 107 are fixed to each other with plural bolts 109. Further, the upper nozzle body 107 is fixed to the support frame 101 with plural bolts 111.

The lower nozzle body 105 is formed with an etchant supply passage 113 composed of a horizontal bore 113A and a vertical bore 113B and with a waste etchant discharge passage 115 composed of a horizontal bore 115A and a vertical bore 115B. Similarly, the upper nozzle body 107 is formed with a vertical etchant supply bore 107A communicating with the vertical bore 113B and with a vertical waste etchant discharge bore 107B communicating with the vertical bore 115B.

Further, the upper nozzle body 107 is formed with a large-diameter recess 107C to which an annular nozzle block 117 is fitted and with an annular recess 107D communicating with the waste etchant discharge bore 107B.

The annular nozzle block 117 is formed with a central hole 117A communicating with the vertical etchant supply bore 107A and four radially-arranged small-diameter holes 117B communicating with the vertical waste etchant discharge bore 107B. Further, the annular nozzle block 117 is formed with a shallow circular recess 117C to which a rubber guide 119 is fitted. This rubber guide 119 is formed with a square central hole 119A to which a square rubber packing 121 is fitted. A plastic mold device sample PM to be decapsuled is placed upside down on this square rubber packing 121 having a central hole 121A through which an etchant is jetted to the lower decapsuling surface of a plastic mold device sample PM.

To cover the plastic mold device 1 to be decapsuled, a glass-made ball-shaped cover cap 123 is mounted on the rubber guide 119. A conical spring 125 is attached to the inner central portion of the cover cap 13 to fixedly support the plastic mold device sample PM. This cap 123 is pushed from the upper side by a cap support rod 127 having a shallow L-shaped lever 127a.

In the construction as described above, an etchant, for instance, such as fuming nitric acid heated at about 60° C. is pressurized by the gear pump 35 so as to flow through the etchant supply passage 113 (the horizontal bore 113A, vertical bore 113B, the vertical etchant supply bore 107A, the central hole 117A) and jetted to the lower surface of the plastic mold device sample PM for decapsuling treatment. The waste etchant is discharged through the waste etchant discharge passage 115 (the holes 117B, the recess 107D, the vertical bore 107B, the horizontal bore 115A) to the waste discharger.

When the plastic mold device sample PM is not covered by the cap 23 for shielding the device sample PM from air, if a part of the plastic mold device sample PM is broken or damaged, since air comes into between the plastic mold device sample PM and the rubber guide 119 and therefore the etchant pressure is changed, so that the etchant supply is stopped and therefore the decapsuling treatment is disabled.

In the present embodiment, however, since the plastic mold device sample PM is covered by the glass cap 23 to shield the device sample PM from the outside air, it is possible to maintain an etchant supply pressure even if the plastic mold device sample PM is partially broken, thus ensuring a reliable decapsuling treatment.

Further, when the size of an integrated circuit within the plastic mold device sample PM is large and therefore the device must be opened completely, since the device sample PM is covered by the cap 23 and therefore no air is introduced into the cap 23, it is possible to perfectly maintain the etchant pressure. Further, when the device sample PM once decapsuled under an offset condition from a required position is to be repaired, it is possible to decapsule the device again by covering the device sample PM by the bell-shaped glass cap 123.

Further, even if the plastic device is spherical in shape (e.g. capacitor), it is possible to decapsule the device sample PM by covering this device by the same cap 123. In this case, the spring 125 and the cap support rod 127 are eliminated and the cap 123 is only put on the device sample PM. Further, the shape of the cap 123 is not limited to a bell-shape and the material of the cap 123 is not limited to glass. A box or cylindrical shaped cap or any material resistant against etchant can be used. Further, it is of course possible to use other elastic members other than the conical spring 125.

Figure 4:
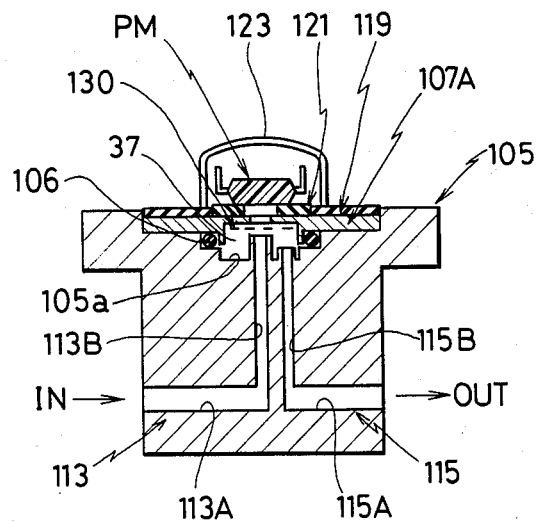
FIG. 4 is an enlarged cross-sectional view of a second embodiment of the plastic mold sample holder for the decapsuling apparatus of the present invention.

FIG. 4 shows a second embodiment of the decapsuling plastic mold sample holder 33A or 33B incorporated in the decapsuling apparatus of the present invention.

In the drawing, the sample holder 33A is composed of a lower nozzle body 105 and a plastic mold device base 107A pressure-fitted to the lower nozzle body 105 via an O-ring 106. The lower nozzle body 105 is formed with an etchant supply passage 113A composed of a horizontal bore 113A and a vertical bore 113B and with a waste etchant discharge passage 115 composed of a horizontal bore 115A and a vertical bore 115B. The feature of this second embodiment is to project both the top ends of the two passages 113 and 115 from the lowermost bottom 105a of a central recess formed in the lower nozzle body 105 so as to provide a trap for preventing relatively small solid matters (e.g. plastic mold pieces) from being mixed with the circulating etchant. Further, it is preferable to provide a filter 130 made of Teflon (Trademark of Du Pont), for instance, in order to more securely prevent relatively large solid matters which may clog the etchant supply and waste etchant discharge passages. The above-mentioned trap and filter are effective when the etchant is recirculated for decapsuling treatment, in particular.

The etchant reservoir 25 is connected to the first etchant chamber 37A via the gear pump 35 and a check valve CV through the pipes 51 and 52; the first etchant chamber 37A is connected to the second etchant chamber 37B via the pipe 47; the second etchant chamber 37B is connected to the bottom of the etchant reservoir 25 via the pipe 49.

Further, one end of a pipe 53 is connected to a point between the first etchant chamber 37A and the check valve CV; the other end of the pipe 53 is connected to the cylinder chamber 19S of the first plunger pump 19; and a valve MV4 is connected between the first inner cylindrical tube 43A and the first plunger pump 19. This valve MV4 is opened/closed in linkage with the first plunger pump 19.

The operation of the decapsulator 5 will be described hereinbelow:

When the gear pump 35 is driven by the motor M3, the operating unit 35S of the gear pump 35 feeds etchant temporarily stored in the etchant reservoir 25 to the first etchant chamber 37A via the pipes 52 and 51 and the check valve CV. Therefore, etchant is jetted upward from the etchant chamber 37A toward a plastic mold device for decapsuling treatment. The jetted etchant is dropped to the same etchant chamber 37A and then to the second etchant chamber 37B via the pipe 47.

Therefore, etchant is further jetted upward from the second etchant chamber 37B toward another plastic mold device for additional decapsuling treatment. The jetted etchant is dropped to the same etchant chamber 37B and then returned to the etchant reservoir 25 via the pipe 49.

As described above, the two plastic mold devices sample PM mounted on the decapsuling holders 33A and 33B can be decapsuled after the gear pump 35 has been actuated for a predetermined time period. The treatment time, that is, the time during which the gear pump 35 is operated depends upon the kind of etchant, the size of the plastic mold device sample PM, the degree of decapsuling treatment.

In the above description, since the pumping unit 35S of the gear pump 35 is dipped in the heating tank 23 and kept at a predetemined temperature, it is possible to circulate and jet etchant toward the decapsuling devices at a constant temperature.

Further, even when etchant leaks from the pumping unit 35S of the gear pump 35, since the leaked etchant can be diluted in the heating tank 23 without being discharged to the outside, it is possible to improve the safety in handling the powerful etchant.

The reason why the rear pump 35 is adopted to circulate etchant to the decapsuling holders 33A and 33B is that the gear pump is high in etchant jetting pressure, accurate in etchant supply quantity, high in response speed, and therefore the decapsuling treatment time can be reduced.

In addition, since the etchant jet pressure can be increased, it is possible to simultaneously jet etchant to several plastic devices to be decapsuled, thus increasing decapsuling efficiency. When fuming nitric acid (the reaction power is moderate) is used as the etchant, the simultaneous decapsuling operation is particularly effective by circulating the etchant through the decapsuling holders 33A and 33B.

When the gear pump 35 is stopped after decapsuling treatment, the used etchant is once collected into the etchant reservoir 25.

The operation of wate discharger 7 will be described hereinbelow.

The waste etchant collected in the etchant reservoir 25 can be introduced into the cylinder chamber 19S via the pipe 53 when the first plunger pump 19 is operated to move the plunger 19P downward with the valve MV4 and the check valve CV open.

Further, a pipe 57 is connected between a spiral neutralizer mixing pipe 59C and the first plunger chamber 19S via a valve MV5. Further, a pipe 59 is connected between the spiral neutralizer mixing pipe 59C and the second plunger chamber 61S of the second plunger pump 61 via a valve MV6. This second plunger pump 61 is driven by a driving motor M2. Another pipe 63 is connected between the valve MV6 and the neutralizer bottle 21.

When the valve MV6 is actuated in the downward direction, for instance and further the second plunger 61P is moved downward, neutralizer in the neutralizer bottle 21 is introduced into the cylinder chamber 61S via the pipe 63 without feeding the neutralizer via the pipe 59. In contrast with this, when the valve MV6 is deactuated in the upward direction, for instance and further the second plunger 61P is moved upward, neutralizer in the cylinder chamber 61S is fed via the pipe 59 without returning the neutralizer via the pipe 63. In the above operation, the valve MV6 is activated or deactivated in linkage with the second plunger pump 61.

The neutralizer stored in the neutralizer bottle 21 is an alkaline neutralizing agent such as sodium carbonate or diluent such as water.

Further, a pipe 25H is connected between the upper surface of the etchant reservoir 25 and the neutralizer bottle 21 via the pipe 13B, so that gas generated in the reservoir 25 can be discharged after being neutralized through the neutralizer bottle 21.

When the first plunger 19P is moved upward with the valve MV4 closed and MV5 open, the waste etchant solution introduced into the first cylinder chamber 19S is fed through the pipe 57 and the spiral pipe 59C opened to the air.

On the other hand, when the second plunger 61P is moved downward by driving the motor M2 with the valve MV6 actuated, a predetermined amount of neutralizer in the neutralizer bottle 21 is introduced into the second cylinder chamber 61S via the pipe 63. Thereafter, when the second plunger 61P is moved upward by driving the motor M2 with the valve MV6 deactuated, the neutralizer in the cylinder chamber 61S is fed through the pipe 59. In the above operation, since both the first and second plungers 19P and 61P are moved upward in synchronism with each other, waste etchant solution fed through the pipe 57 and neutralizer or water fed through the pipe 59 are mixed with each other in the spiral pipe 59C and therefore neutralizer or dilated before being discharged outside. Therefore, it is possible to discharge the waste etchant solution without contaminating the environment.

Further, in FIG. 1, the reference numeral 65 denotes a liquid saucer disposed under the heating tank 23 for receiving leaked etchant or liquid. Further, the first and second plunger pumps 19 and 61 are operated by detecting plunger position by use of microswitches. Further, in the above embodiment, the gear pump 35 is used. However, without being limited thereto, it is also possible to use a high pressure hydraulic pump. Furthermore, it is possible to use vapor etchant or vapor-liquid mixture etchant in place of the liquid etchant.

Further, it is also possible to use heated air, heated metal powder or a heated solid medium in stead of the heated liquid within the heating tank.

As described above, in the plastic mold device sample holder of the plastic mold decapsuling apparatus of the present invention, since the device sample is decapsuled under shield condition from outside air, it is possible to prevent etchant recirculating pressure from being changed, so that it is possible to allow a reliable decapsulation treatment.

Further, since the sample holder of the plastic mold decapsuling apparatus of the present invention is provided with a filter and a trap in the etchant chamber of the holder, it is possible to prevent broken plastic mold pieces from being mixed with the etchant or from clogging the etchant supply passage and/or the waste etchant discharge passage.

What is claimed is:

1. A plastic mold decapsuling apparatus for decapsuling a plastic mold by feeding an etchant to the plastic mold, which comprises:
   (a) means for storing an etchant;
   (b) means for heating the etchant stored in said storing means;
   (c) means for supporting a plastic mold to be decapsuled;
   (d) means for feeding the etchant heated by said heating means to the plastic mold supported by said supporting means to decapsule the plastic mold; and
   (e) means for shielding the plastic mold supported by said supporting means from outside air to maintain pressure of the etchant fed by said feeding means.

2. The plastic mold decapsuling apparatus as set forth in claim 1, wherein said plastic mold shielding means is a bell-shaped cover cap.

3. The plastic mold decapsuling apparatus as set forth in claim 2, wherein said bell-shaped cover cap is made of glass.

4. The plastic mold decapsuling apparatus as set forth in claim 2, wherein said plastic mold shielding means further comprises elastic means, attached to inside of said bell-shaped cover cap, for elastically urging the plastic mold against said plastic mold supporting means.

5. The plastic mold decapsuling apparatus as set forth in claim 4, wherein said plastic mold shielding means further comprising fixing means for fixing said bell-shaped cover cap from outside of said cover cap.

6. A plastic mold decapsuling apparatus comprising:
   (a) an etchant bottle for containing an etchant to decapsule a capsuled plastic mold;
   (b) a heat tank for containing a heating medium kept at a constant temperature;
   (c) an etchant reservoir, disposed within said heat tank, for containing a predetermined amount of the heated etchant;
   (d) at least one decapsuling plastic mold holder for holding a plastic mold to be decapsuled;
   (e) first etchant feeding means for selectively feeding a predetermined amount of the etchant from said etchant bottle to said etchant reservoir and waste etchant from said decapsuling plastic mold holder to outside;
   (f) second etchant feeding means, disposed within said heat tank, for circulating the etchant in said etchant reservoir through said decapsuling plastic mold holder; and
   (g) means for shielding the plastic mold held by said decapsuling plastic mold holder from outside air to maintain pressure of the etchant fed by said second etchant feeding means.

7. The plastic mold decapsuling apparatus as set forth in claim 1, wherein said plastic mold supporting means further comprises filter means, disposed between an etchant nozzle end and a decapsule surface of the plastic mold in said plastic mold supporting means, for preventing broken plastic mold pieces from being mixed with the etchant being fed.

8. The plastic mold decapsuling apparatus as set forth in claim 7, wherein said plastic mold supporting means further comprises trap means for trapping plastic mold pieces, said trap means being formed by projecting the etchant nozzle end and a waste etchant discharge passage end from a bottom of an etchant chamber formed in said plastic mold supporting means.

* * * * *